(12) United States Patent
Chi et al.

(10) Patent No.: US 6,760,228 B1  
(45) Date of Patent: Jul. 6, 2004

(54) APPARATUS FOR SECURING A REMOVABLE CIRCUIT CARD IN A COMPUTING SYSTEM

(75) Inventors: Hye Suk Chi, Raleigh, NC (US); Timothy Wayne Crockett, Raleigh, NC (US); Albert Vincent Makley, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/374,121

(22) Filed: Feb. 25, 2003

(51) Int. Cl.[7] .................................................. H05K 1/18
(52) U.S. Cl. ...................................... 361/737; 235/492
(58) Field of Search ................................ 361/737, 747, 361/740, 759, 726, 785, 787; 439/680, 681; 235/382, 475, 479, 492

(56) References Cited

U.S. PATENT DOCUMENTS

| | | | |
|---|---|---|---|
| 4,096,548 A | 6/1978 | Misono et al. | |
| 4,655,057 A | 4/1987 | Derman | |
| 4,685,312 A | 8/1987 | Lakoski et al. | |
| 4,964,286 A | 10/1990 | Poyer | |
| 5,169,332 A | 12/1992 | Cooke et al. | |
| 5,190,465 A | 3/1993 | Davidge et al. | |
| 5,803,762 A | * 9/1998 | Green | 439/347 |
| 6,269,005 B1 | * 7/2001 | Tung et al. | 361/737 |
| 6,373,713 B1 | 4/2002 | Jensen et al. | |
| 6,422,469 B1 | * 7/2002 | Pernet | 235/486 |
| 6,424,542 B1 | 7/2002 | Benson | |

* cited by examiner

*Primary Examiner*—David Martin  
*Assistant Examiner*—Dameon E. Levi  
(74) *Attorney, Agent, or Firm*—Ronald V. Davidge, Esq.

(57) ABSTRACT

A circuit card includes a key receptacle and at least one movable braking member, holding the circuit card in place within a card receptacle of an electronic device when a key is not fully inserted within the key receptacle. When the key is so inserted, the circuit card can be easily removed. Preferably, the key includes a releasable latch holding the key within the key receptacle.

20 Claims, 2 Drawing Sheets

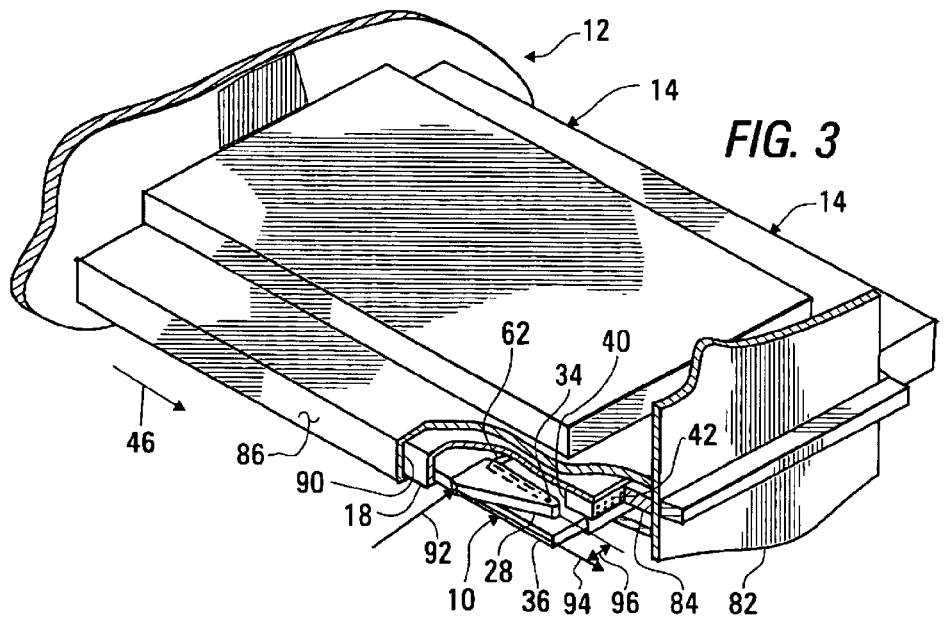
FIG. 3
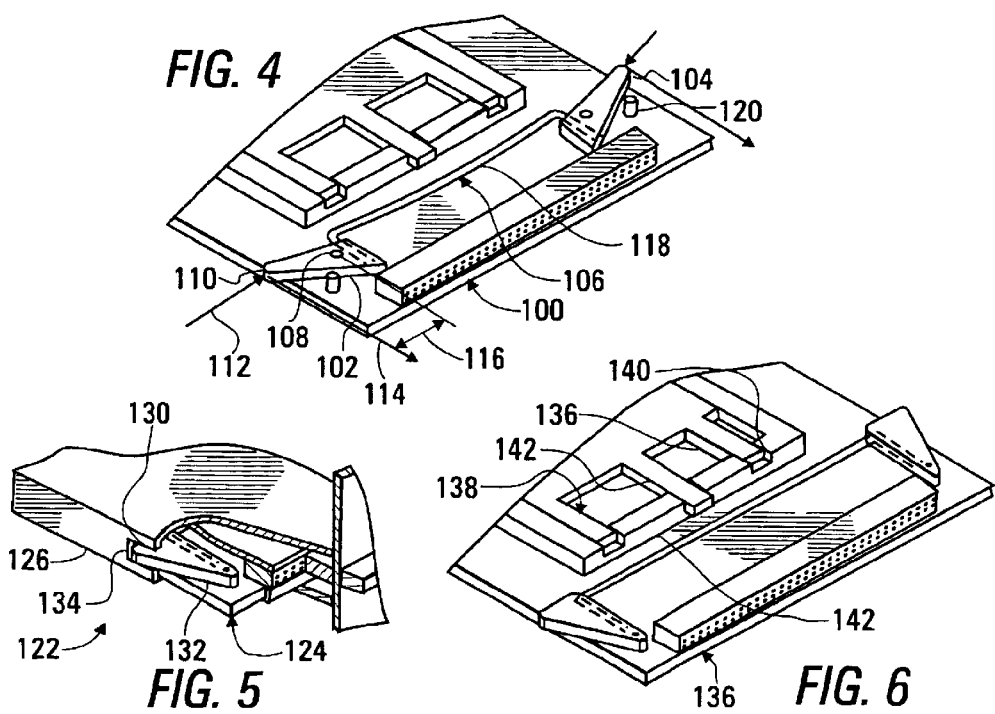
FIG. 4
FIG. 5
FIG. 6

APPARATUS FOR SECURING A REMOVABLE CIRCUIT CARD IN A COMPUTING SYSTEM

BACKGROUND OF THE INVENTION

1. Field of the Invention

This invention relates computer hardware security and, more particularly, to an apparatus for selectively securing an externally accessible circuit card within a computing system or other electronic device.

2. Summary of the Background Art

As data becomes increasingly available in encoded formats that require an electronic device, such as a computing system, to make the data visible and usable, there is an increasing need for various organizations to make such devices publicly available under certain conditions. For example, libraries frequently provide computing systems for use by the public within the library to aid in finding and displaying information as required. A library may wish to make laptop systems available in this way in order to provide convenience of use and further to avoid the dedicated space requirements associated with the use of desktop computers.

One problem with making laptop computers publicly available in this way arises from the fact that, while the computers themselves are large enough to make their theft difficult, externally accessible cards, known as PC Cards, are small enough to be easily concealed and stolen. Such cards are often needed to provide a laptop computer with functions needed within such an environment, such as an ability to connect to a wired or wireless network.

PC Cards are built according to the standards of the PCMCIA (Personal Computer Memory Card International Association) to fit into slots that are now widely available on laptop computers, and to provide various functions that are not generally provided within the computers themselves, such as connection to networks. The slots are externally accessible, with the cards being readily installed and removed. Since the cards are the length and width of a credit card, with variations in overall thickness as provided by the PCMCIA standards, these cards are easily concealed and stolen. On the other hand, much of the usefulness of PC Cards arises from the fact that they can be easily removed and used in another standard computer, with the card mounting structures and connectors associated with the sockets being built to widely used standards.

Nonvolatile memory can also be added to a number of laptop computers and other electronic devices by installing removable cards having either the PC Card configuration or a somewhat different Compact Flash Card shape.

Therefore, what is needed is a way to make small, externally accessible circuit cards selectively difficult to remove, so that they cannot be easily stolen, while allowing the easy removal and replacement of the cards by personnel of the organization owning the cards and the computing systems.

In early personal computing systems, circuit cards and other optional small devices were held within the covers of the computer, with conventional locking mechanisms, having cylinders turned by keys, holding the covers shut to protect the devices inside. U.S. Pat. No. 5,169,332 describes apparatus protecting external devices, such as a cable connector, a terminator, or a shield covering a port connector from unauthorized removal by making the devices removable only through access within the locked covers of a computing system.

A number of other patents describe the use of additional conventional locks to prevent the removal of devices from computers and other electronic systems, or to prevent access to various parts of the systems. For example, U.S. Pat. No. 5,190,465 describes cover assemblies, fastened in place by conventional locks, for preventing the removal of an external cable from a computer. U.S. Pat. Nos. 4,655,057 and 4,964,286 describe the use of locking covers to prevent access to the slot in which a videocassette is inserted within a videocassette recorder. U.S. Pat. No. 4,685,312 describes the use of a locking device to prevent access to the slot through which removable media is inserted into a computer disk drive unit.

As some computing systems, such as laptop computers, became smaller and more portable, some of the functions provided by relatively large cards housed within the computing systems were assigned to the small, removable and interchangeable PC Cards. Again, what is needed is a way to prevent the unauthorized removal of such cards, preferably without requiring the use of bulky covers having locking cylinders and further without requiring modification to a conventional computer having provisions for using such cards.

Other patents describe methods for mounting printed circuit boards within electronic devices without addressing a means to provide for selective removal, requiring possession of a key, to prevent theft. For example, U.S. Pat. No. 6,424,542 describes a PC Card holder mounted on a circuit board, with a card retainer being mounted adjacent to the holder to prevent unintentional movement of the card out of an engaged position when the holder is subjected to vibrations. The retainer preferably includes a finger having a hook formed on a free end thereof that is yieldably biased into a position in which it blocks the unintended movement. When the card is being intentionally removed from the holder, movement of the card deflects the finger to allow passage of the card. U.S. Pat. No. 4,096,548 describes a circuit board that is retained in a fixed position within a rack frame by a leaf spring, flexibly mounted on the circuit board, which has a detent portion engageable in a recess in the rack frame. A rod mounted on the circuit board by a bracket is operable to engage the leaf spring and to move the detent portion into and out of engagement with the recess. U.S. Pat. No. 6,373,713 describes a mechanism for inserting, extracting, sensing, and locking a printed circuit board assembly in an electronic system with a single handle.

U.S. Pat. No. 6,269,005 describes the use of a pair of flexible arms having projections extending outward into slots within a PC Card retainer to hold a dummy card in a space within such a retainer, which has been configured for a relatively thick Type III card, above a relatively thin Type I or II card. The dummy card blocks an air passage that might otherwise allow dirt and dust to enter the computer.

SUMMARY OF THE INVENTION

Accordingly, it is a first objective of the invention to provide a means for preventing the removal of a circuit card from an electronic device without the use of a key.

It is a second objective of the invention to provide a means for allowing the easy removal and insertion of the circuit with the use of a key.

It is a third objective of the invention to provide a means for selective removal of a card from a standard PC Card slot without a need to modify the slot.

In accordance with a first aspect of the invention, circuit card apparatus selectively removable from a card receptacle is provided. The circuit card apparatus includes a circuit board, guiding surfaces, a key receptacle, a key, and a first braking member. The guiding surfaces are attached to the circuit board for guiding the circuit board into the card receptacle. The key is removably insertable within the key receptacle. The first braking member is movably mounted within the circuit card apparatus. The first braking member is held in an extended position, extending outward to contact the card receptacle, with the key removed from the key receptacle. The first braking member is held in a retracted position, displaced inward from the extended position, when the key is fully inserted in the key receptacle.

BRIEF DESCRIPTION OF THE INVENTION

FIG. 3 is a fragmentary perspective view of the electronic device of FIG. 1 with the circuit card of FIG. 1 installed therein;

FIG. 4 is a fragmentary perspective view of a circuit card built in accordance with a first alternative version of the invention, shown with a cover removed to reveal internal details;

FIG. 5 is a fragmentary perspective view of an electronic device and a circuit card built in accordance with a second version of the invention; and FIG. 6 is a fragmentary perspective view of a circuit card made in accordance with the first version of the invention to accept a key different from the key of FIG. 1.

DETAILED DESCRIPTION OF THE INVENTION

Figure 1:
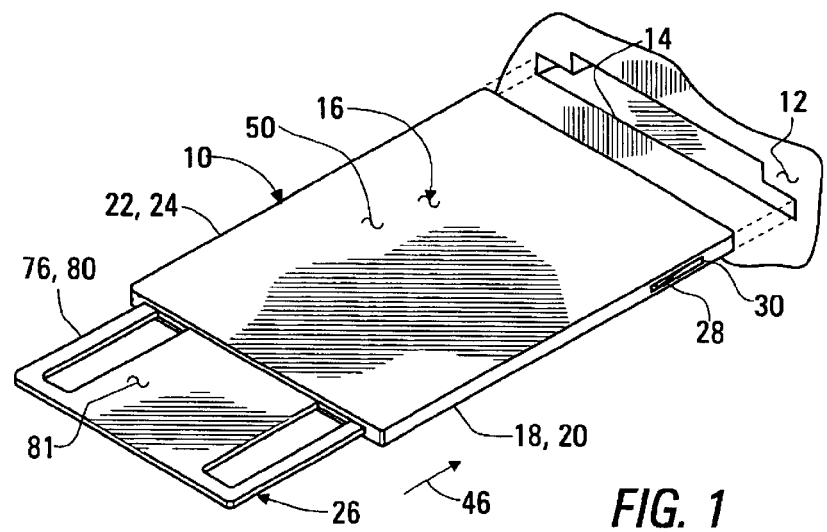
FIG. 1 is a perspective view of a circuit card made in accordance with a first version of the invention, in an exploded relationship with an electronic device having a receptacle into which the circuit card is inserted.

FIG. 1 is a perspective view of a circuit card 10, built in accordance with a first version of the present invention for insertion, shown in an exploded relationship with an electronic device 12, having a card receptacle 14, with the circuit card 10 being configured for insertion into the card receptacle 14 and for selective removal therefrom. The circuit card 10 includes a cover 16 forming a first guiding surface 18 extending along a first edge 20 of the circuit card 10 and a second guiding surface 22 extending along a second edge 24 of the circuit card 10. A key 26 held within the circuit card 10 holds a first braking member 28 retracted within the circuit card 10, allowing the circuit card 10 to be inserted into the card receptacle 14 and to be removed therefrom. When the key 26 is removed from the circuit card 10, the first braking member 28 extends outward through a slot 30 in the cover 16.

Figure 2:
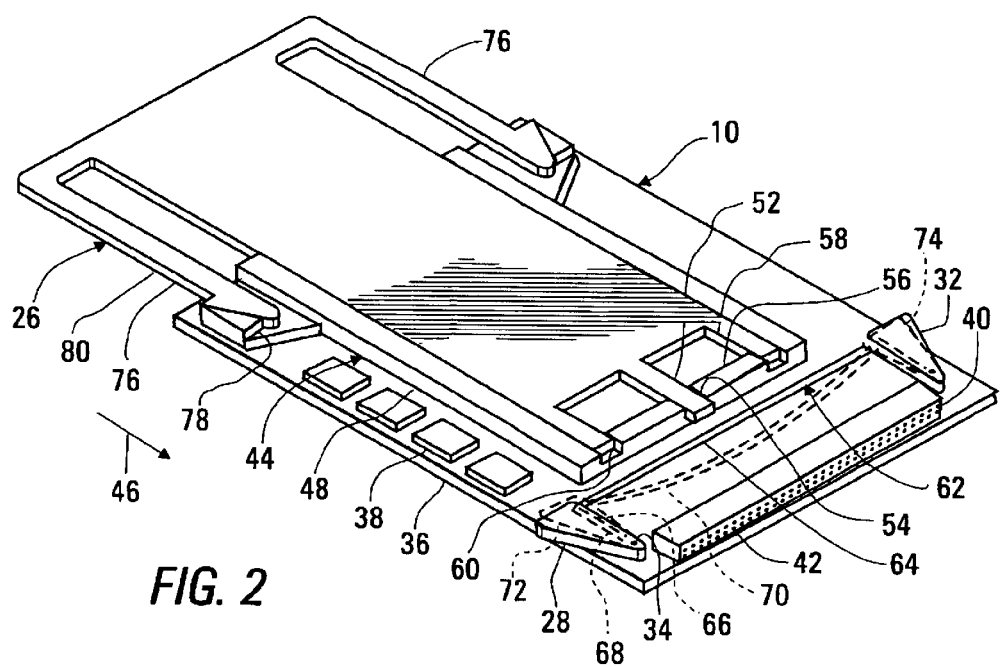
FIG. 2 is a perspective view of the circuit card of FIG. 1, shown with a cover removed to reveal internal details.

FIG. 2 is a perspective view of the circuit card 10 with the cover 16 removed to reveal internal structure. Preferably, the circuit card 10 additionally includes a second braking member 32 moving through a second slot (not shown) in the cover 16, with each of the braking members 28, 32 being pivotally mounted within the circuit card 10 by means of a pin 34. The circuit card 10 also includes a circuit board 36, having a number of surface-mounted electronic modules 38 and a connector 40 including a number of sockets 42 through which external electrical connections are made to circuits extending along and within the circuit board 36.

The circuit card 10 further includes a key receptacle 44 for guiding the key 26 as it is inserted into the circuit card 10 in an insertion direction of arrow 46 and as it is removed from the circuit card 10 in a withdrawal direction opposite the direction of arrow 46. In the example of FIG. 2, the key receptacle 44 is formed by a key receptacle structure 48 extending under the key 26 as it is inserted into the circuit card 10, together with an upper portion 50 of the cover 16 extending over the key 26 within the circuit card 10. As the key 26 is fully inserted in the direction of arrow 46, a distal end 52 of the key 26 extends through a pathway provided by a slot 54 within an interposing structure 56. Preferably, the key 26 also includes key identification surfaces 58, such as additional tabs forming an insertion limiting structure, that are unique to a type of key of which the key 26 is an example, while the interposing structure 24 includes an additional pathway, formed, for example, by slots 60, that is unique to a corresponding type of card of which the circuit card 10 is an example.

The circuit card 10 additionally includes a spring member 62 extending between the braking members 28, 32 to hold the braking members 28, 32 in their extended positions, in which they extend outward through their adjacent slots 30, 34, when the key 26 is not inserted into the key receptacle 44. In the example of FIG. 2, the spring member is a "U"-shaped member, having a central portion 64 and a leg 66 at each end attached to the adjacent braking member 28, 32. The legs 66 may be pressed into holes 68 within the braking members 28, 32. When the key 26 is fully inserted into the key receptacle 44, the distal end 52 of the key 26 deflects the spring member 62 into the bowed condition shown by dashed lines 70. This deflection causes the braking members 28, 32 to pivot inward, as shown by dashed lines 72, 74.

The key 26 also includes a pair of releasable latches 76 that contact latching surfaces 78 within the circuit card 10 as the key 26 is withdrawn, opposite the direction of arrow 46, from its fully installed position. This latching function resists a tendency of the key 26 to be pushed outward by the deflected spring member 62 and facilitates handling the circuit card 10 with the key 26 installed. In the example of FIG. 2, the latching surfaces 78 form parts of the key receptacle structure 48. Each of the releasable latches 76 includes an accessible portion 80 that extends outward from the circuit card 10 when the key 26 is fully inserted into the key receptacle 44. When these two accessible portions 80 are pushed toward one another, the latches 76 are released by being moved to clear the latching surfaces 78 as the key 26 is withdrawn.

With the key 26 fully inserted in the key receptacle 44, the circuit card 10 may be withdrawn by pulling on a central portion 81 of the key extending outward from the key receptacle 44, by pulling on the circuit card 10 itself if it extends outward from the card receptacle 14, or by pushing a button (not shown), commonly provided with receptacles for PC Cards, that causes a mechanism to push the card 10 outward.

FIG. 3 is a fragmentary perspective view of the electronic device 12 with the circuit card 10 installed therein. Various elements, including the card receptacle 14, the key receptacle structure 48, a cable 82, and a cable connector 84, are shown as partly cut away to reveal internal structures. The circuit card 10 is shown in its fully inserted position, with the connector 40 of the circuit card 10 engaging the cable connector 84 so that individual pins (not shown) extending from the cable connector make electrical contact with the individual sockets 42 within the circuit card connector 40. In this way, individual circuits within the circuit board 36 are connected to individual conductors within the cable 82.

Referring to FIGS. 2 and 3, along each edge 86, 88 the card receptacle 14 includes a card guide surface 90 engaging the guiding surfaces 18, 22 of the circuit card 10 to guide the circuit card as it is inserted in the direction of arrow 46 and as it is removed opposite this direction. The first braking member 28 and the second braking member 32 in their fully extended positions drag against these guide surfaces 90 of the card receptacle 14 whenever the circuit card 10 is moved within the card receptacle 14. When the key 26 is not inserted within the key receptacle 44, the undeflected spring member 62 produces a torque on the braking members 28, 32 to establish a normal force acting between the card guide surfaces 90 of the card receptacle 14 and the braking members 28, 32. In FIG. 2, this normal force is represented by an arrow 92.

In particular, when an attempt is made to remove the circuit card 10 by pulling opposite the direction of arrow 46, a friction force, represented by arrow 94, brought about by sliding along the adjacent card guide surface 90 of the card receptacle 14, produces a torque about the pivot pin 34. This torque, which arises from the friction force acting through an offset distance 96, increases the torque producing the normal force represented by arrow 92, so that the braking member acts as a self-actuating, or locking, brake. Similar forces act on the second braking member 32. This self-actuating property of the braking members 28, 32 helps to frustrate an attempt to remove the circuit card 10 without the key 26 inserted within the key receptacle 44.

FIG. 4 is a fragmentary perspective view of a circuit card 100, built in accordance with a second version of the present invention, which is shown with a cover removed to reveal internal structure. The circuit card 100 is identical to the circuit card 10, described above in reference to FIGS. 1–3, except that geometrical parameters associated with the braking members 102, 104 and of the spring member 106 of the circuit card 100 have been changed to increase the effectiveness of the self-actuating property of these braking members 102, 104. Specifically, the pivot pins 108 about which the braking members 102, 104 are pivoted are moved inward, away from the points 110 at which forces are applied to each of the braking members 102, 104 by contact with adjacent surfaces of the card receptacle 14 (shown in FIG. 3). These forces include a normal force represented by the arrow 112 and a frictional force represented by an arrow 114, which arises whenever an attempt is made to remove the circuit card 100 without a key 26 inserted into the key receptacle 44 of the circuit card 100. This change in the location of the pivot pins 106 increases the offset distance 114 through which the frictional force represented by arrow 116 acts to produce a torque increasing the normal force represented by arrow 112, so that the self-actuating braking effect is accentuated.

Preferably, the central portion 118 of the spring member 106 is somewhat curved in its undeflected condition so that the braking members 102, 104 can rotate in the directions established by the friction forces represented by arrows 116 before the central portion 118 of the spring member 106 is pulled into a straight condition. The pivoting motion of the braking members 102, 104 in response to these friction forces may be limited by the straightening of the central portion 118 or by a pair of optional stops 120 providing rigid stopping surfaces.

FIG. 5 is a fragmentary perspective view of an alternate electronic device 122 with a circuit card 124 installed therein in accordance with a third version of the invention. A cover of the circuit card 124 and a portion of the card receptacle 126 of the electronic device 122 are cut away to reveal internal structure. The alternate electronic device 122 and the circuit card 124 are similar to the electronic device 12 and circuit card 10 described above in reference to FIGS. 1–3, except that the card receptacle 128 of the alternate electronic device 122 includes a slot 130 into which a braking member 132 extends when the circuit card 124 is fully inserted within the card receptacle 128 without the key 26 inserted in the key receptacle 44 (shown in FIG. 2). The slot 130 includes a stopping surface 134 that prevents removal of the circuit card 124 if an attempt is made to remove the card 124 without the key 26 inserted therein.

The first and second versions of the invention, as described above in reference to FIGS. 1–4, have the significant advantage of being operable with cards built as described above in standard, unmodified versions of computer systems and other electronic devices. In particular, the card can be configured to fit in a conventional slot for a PC Card or for a Compact Flash Card. There are three versions of a slot for a PC card, but they all have the same configuration of card receptacle guiding surfaces, such as the guiding surfaces 90 of FIG. 3. Thus, the braking members, acting on these common guiding surfaces 90, can be used in any of the three kinds of slots. The braking members can also be formed according to a slot pattern used to prevent the inverted insertion of a PC Card.

On the other hand, the third version of the invention, as described above in reference to FIG. 5, requires the electronic device to be modified to include the slots 130. However, this version has the advantage of providing a positive stop to prevent removal of the circuit card without the key.

FIG. 6 is a fragmentary perspective view of a circuit card 136, built in accordance with the first version of the invention to be identical to the circuit card 10, described above in reference to FIGS. 1–3, except for changes in the key identification surfaces 136 of the key 138, and in the pathway 140 for such surfaces through the interposing structure 142. For example, keys for circuit cards of a certain type may be made to fit only in circuit cards of a corresponding type. If a skeleton key is needed to fit in cards of all types, it may have only a portion common to the types, such as the distal portion 142.

While the invention has been described in its preferred versions or embodiments with some degree of particularity, it is understood that this explanation has been given only by way of example and that numerous changes in the arrangement and configuration of parts can be made without departing from the spirit and scope of the invention, as described in the appended claims.

What is claimed is:

1. Circuit card apparatus selectively removable from a card receptacle, comprising:
   a circuit board;
   guiding surfaces attached to said circuit board and extending along opposite edges of said circuit board for guiding said circuit board into said card receptacle;
   a key receptacle attached to said circuit board;
   a key removably insertable within said key receptacle; and
   a first braking member movably mounted within said circuit card apparatus, wherein said first braking member is held in an extended position, extending outward to contact said card receptacle, with said key removed from said key receptacle, and wherein said first braking member is held in a retracted position, displaced inward from said extended position, when said key is fully inserted in said key receptacle.

2. The circuit card apparatus of claim 1, additionally comprising a first releasable latch holding said key fully inserted within said key receptacle.

3. The circuit card apparatus of claim 1, wherein said key includes an insertion limiting structure, and said circuit card apparatus additionally comprises an interposing member providing a path for passage of said insertion limiting structure as said key is fully inserted within said key receptacle.

4. The apparatus of claim 1, additionally comprising a second braking member movably mounted within said circuit card apparatus, wherein said second braking member is held in an extended position, extending outward to contact said card receptacle, with said key removed from said key receptacle, and wherein said second braking member is held in a retracted position, displaced inward from said extended position, when said key fully inserted in said key receptacle.

5. The circuit card apparatus of claim 4, wherein said first braking member extends outward from a first edge of said circuit card apparatus with said key removed from said key receptacle, and said second braking member extends outward from a second edge of said circuit card apparatus, opposite said first edge of said circuit card apparatus, with said key removed from said key receptacle.

6. Circuit card apparatus selectively removable from a card receptacle, comprising:

a circuit board;

guiding surfaces attached to said circuit board and extending along opposite edges of said circuit board for guiding said circuit board into said card receptacle;

a key receptacle attached to said circuit board;

a key removably insertable within said key receptacle; and a first braking member movably mounted within said circuit card apparatus, wherein said first braking member is held in an extended position, extending outward to contact said card receptacle, with said key removed from said key receptacle, and wherein said first braking member is held in a retracted position, displaced inward from said extended position, when said key is fully inserted in said key receptacle, and wherein said first braking member extends outward from a first edge of said circuit card apparatus with said key removed from said key receptacle a second braking member movably mounted within said circuit card apparatus, wherein said second braking member is held in an extended position, extending outward to contact said card receptacle, with said key removed from said key receptacle, and wherein said second braking member is held in a retracted position, displaced inward from said extended position, when said key fully inserted in said key receptacle, and wherein said second braking member extends outward from a second edge of said circuit card apparatus, opposite said first edge of said circuit card apparatus, with said key removed from said key receptacle; and a spring member extending between said first and second braking members, wherein said spring member holds said first braking member in said extended position of said first braking member and said second braking member in said extended position of said second braking member with said key removed from said key receptacle, and wherein said key has a distal end deflecting said spring member as said key is fully inserted in said key receptacle to move said first braking member into said retracted position of said first braking member and to move said second braking member into said retracted position of said second braking member.

7. The circuit card apparatus of claim 6, wherein said first and second braking members are each pivotally mounted within said circuit card apparatus, a first end of said spring member is rigidly attached to said first braking member, a second end of said spring member, opposite said first end of said spring member, is rigidly attached to said second braking member, said distal end of said key contacts said a central portion of said spring member to cause pivoting movement of said first and second braking members as said key is fully inserted into said key receptacle.

8. The circuit card apparatus of claim 7, additionally including an interposing structure having a pathway, wherein said key additionally includes a tab moving within said pathway as said key is fully inserted within said key receptacle.

9. The circuit card apparatus of claim 6, wherein said key receptacle includes a first latching surface, said key includes a first releasable latch movable with said key in said fully inserted position between a latched position and an unlatched position, said first releasable latch in said latched position contacts said first latching surface as said key is moved from said fully inserted position to prevent removal of said key from said key receptacle, and said first releasable latch in said released position moves past said first latching surface as said key is moved from said fully inserted position to allow removal of said key from said key receptacle.

10. The circuit card apparatus of claim 9, wherein said first latching surface is disposed adjacent said first edge of said circuit card apparatus, said key receptacle additionally includes a second latching surface, disposed adjacent said second edge of said circuit card apparatus, said key additionally includes a second releasable latch movable with said key in said fully inserted position between a latched position and an unlatched position, said second releasable latch in said latched position contacts said second latching surface as said key is moved from said fully inserted position to prevent removal of said key from said key receptacle, and said second releasable latch in said released position moves past said second latching surface as said key is moved from said fully inserted position to allow removal of said key from said key receptacle.

11. The circuit card apparatus of claim 10, wherein each of said first and second releasable latches includes an accessible portion extending outward from said key receptacle with said key fully inserted in said key receptacle, and moving said accessible portions of said first and second releasable latches toward one another moves said first releasable latch into said released position of said first releasable latch and moves said second releasable latch into said released position of said second releasable latch.

12. Apparatus comprising an electronic device including a card receptacle and a circuit card selectively removable from said card receptacle, wherein said circuit card includes:
a circuit board;
guiding surfaces attached to said circuit board and extending along opposite edges of said circuit board for guiding said circuit board into said card receptacle
a key receptacle attached to said circuit board;
a key removably insertable within said key receptacle; and
a first braking member movably mounted within said circuit card, wherein said first braking member is held in an extended position, extending outward to contact said card receptacle, with said key removed from said key receptacle, and wherein said first braking member is held in a retracted position, displaced inward from said extended position, when said key is fully inserted in said key receptacle.

13. The apparatus of claim 12, wherein
said circuit card is removed from said card receptacle by moving said circuit card in a withdrawal direction within said card receptacle with said key fully inserted in said key receptacle, and
a friction force generated between said first braking member and said key receptacle by moving said circuit card in said withdrawal direction with said key removed from said card receptacle increases a normal force exerted between said first braking member and said card receptacle.

14. The apparatus of claim 13, wherein
said first braking member extends outward from a first edge of said circuit card with said key removed from said key receptacle, and
said circuit card additionally includes a second braking member movably mounted within said circuit card,
said second braking member is held in an extended position, extending outward from a second edge of said card receptacle, opposite said first edge to contact said card receptacle, with said key removed from said key receptacle,
said second braking member is held in a retracted position, displaced inward from said extended position, when said key is fully inserted in said key receptacle, and
a friction force generated between said second braking member and said key receptacle by moving said circuit card in said withdrawal direction with said key removed from said card receptacle increases a normal force exerted between said second braking member and said card receptacle.

15. Apparatus comprising an electronic device including a card receptacle and a circuit card selectively removable from said card receptacle, wherein said circuit card includes:
a circuit board;
guiding surfaces attached to said circuit board and extending along opposite edges of said circuit board for guiding said circuit board into said card receptacle
a key receptacle attached to said circuit board;
a key removably insertable within said key receptacle; and
a first braking member pivotally mounted within said circuit card, wherein said first braking member is held in an extended position, extending outward to contact said card receptacle, with said key removed from said key receptacle, and wherein said first braking member is held in a retracted position, displaced inward from said extended position, when said key is fully inserted in said key receptacle, wherein said circuit card is removed from said card receptacle by moving said circuit card in a withdrawal direction within said card receptacle with said key fully inserted in said key receptacle, wherein a friction force generated between said first braking member and said key receptacle by moving said circuit card in said withdrawal direction with said key removed from said card receptacle increases a normal force exerted between said first braking member and said card receptacle, and wherein said first braking member extends outward from a first edge of said circuit card with said key removed from said key receptacle;
a second braking member pivotally mounted within said circuit card wherein said second braking member is held in an extended position, extending outward from a second edge of said card receptacle, opposite said first edge to contact said card receptacle, with said key removed from said key receptacle, wherein said second braking member is held in a retracted position, displaced inward from said extended position, when said key is fully inserted in said key receptacle, and wherein a friction force generated between said second braking member and said key receptacle by moving said circuit card in said withdrawal direction with said key removed from said card receptacle increases a normal force exerted between said second braking member and said card receptacle; and
a spring member extending between said first and second braking members, wherein said spring member holds said first braking member in said extended position of said first braking member and said second braking member in said extended position of said second braking member with said key removed from said key receptacle, wherein said key has a distal end deflecting said spring member as said key is fully inserted in said key receptacle to move said first braking member into said retracted position of said first braking member and to move said second braking member into said retracted position of said second braking member, a first end of said spring member is rigidly attached to said first braking member, wherein a second end of said spring member, opposite said first end of said spring member, is rigidly attached to said second braking member, and wherein said distal end of said key contacts said a central portion of said spring member to cause pivoting movement of said first and second braking members as said key is fully inserted into said key receptacle.

16. The apparatus of claim 12, wherein
said circuit card is removed from said card receptacle by moving said circuit card in a withdrawal direction within said card receptacle with said key fully inserted in said key receptacle, and
said card receptacle includes a first stopping surface contacting said first braking member in said extended position when said circuit card is moved in said withdrawal direction from said fully inserted position to prevent removal of said circuit card from said card receptacle with said key removed from said key receptacle.

17. The apparatus of claim 16, wherein
said first braking member extends outward from a first edge of said circuit card with said key removed from said key receptacle, and said circuit card additionally includes a second braking member movably mounted within said circuit card, said second braking member is held in an extended position, extending outward from a second edge of said circuit card, opposite said first edge, to contact said card receptacle, with said key removed from said key receptacle, said second braking member is held in a retracted position, displaced inward from said extended position, when said key is fully inserted in said key receptacle, and said card receptacle includes a second stopping surface contacting said second braking member in said extended position when said circuit card is moved in said withdrawal direction from said fully inserted position to prevent removal of said key from said card receptacle with said key removed from said key receptacle.

18. Apparatus comprising an electronic device including a card receptacle and a circuit card selectively removable from said card receptacle, wherein said circuit card includes:

a circuit board;

guiding surfaces attached to said circuit board and extending along opposite edges of said circuit board for guiding said circuit board into said card receptacle a key receptacle attached to said circuit board;

a key removably insertable within said key receptacle; and a first braking member movably mounted within said circuit card, wherein said first braking member is held in an extended position, extending outward to contact said card receptacle, with said key removed from said key receptacle, and wherein said first braking member is held in a retracted position, displaced inward from said extended position, when said key is fully inserted in said key receptacle, wherein said circuit card is removed from said card receptacle by moving said circuit card in a withdrawal direction within said card receptacle with said key fully inserted in said key receptacle, wherein said card receptacle includes a first stopping surface contacting said first braking member in said extended position when said circuit card is moved in said withdrawal direction from said fully inserted position to prevent removal of said circuit card from said card receptacle with said key removed from said key receptacle, and wherein said first braking member extends outward from a first edge of said circuit card with said key removed from said key receptacle;

a second braking member movably mounted within said circuit card, wherein said second braking member is held in an extended position, extending outward from a second edge of said circuit card, opposite said first edge, to contact said card receptacle, with said key removed from said key receptacle, wherein said second braking member is held in a retracted position, displaced inward from said extended position, when said key is fully inserted in said key receptacle, and wherein said card receptacle includes a second stopping surface contacting said second braking member in said extended position when said circuit card is moved in said withdrawal direction from said fully inserted position to prevent removal of said key from said card receptacle with said key removed from said key receptacle; and a spring member extending between said first and second braking members, wherein said spring member holds said first braking member in said extended position of said first braking member and said second braking member in said extended position of said second braking member with said key removed from said key receptacle, wherein said key has a distal end deflecting said spring member as said key is fully inserted in said key receptacle to move said first braking member into said retracted position of said first braking member and to move said second braking member into said retracted position of said second braking member, wherein said first and second braking members are each pivotally mounted within said circuit card, wherein a first end of said spring member is rigidly attached to said first braking member, wherein a second end of said spring member, opposite said first end of said spring member, is rigidly attached to said second braking member, and wherein said distal end of said key contacts said a central portion of said spring member to cause pivoting movement of said first and second braking members as said key is fully inserted into said key receptacle.

19. Apparatus including a plurality of different types of circuit cards, wherein each of said circuit cards includes:

a circuit board;

guiding surfaces attached to said circuit board for guiding said circuit board into said card receptacle a key receptacle attached to said circuit board;

an interposing structure including a pathway unique to each of said different types of circuit cards, a key removably insertable within said key receptacle, wherein said key includes key surfaces unique to one of said different types of circuit cards, movable within said pathway to allow said key to be fully inserted within said key receptacle; and a first braking member movably mounted within said circuit board, wherein said first braking member is held in an extended position, extending outward to contact said card receptacle, with said key removed from said key receptacle, and wherein said first braking member is held in a retracted position, displaced inward from said extended position, when said key is fully inserted in said key receptacle.

20. The apparatus of claim 19, additionally comprising a first releasable latch holding said key fully inserted within said key receptacle.

* * * * *